(12) United States Patent
Wang et al.

(10) Patent No.: US 8,535,753 B2
(45) Date of Patent: Sep. 17, 2013

(54) METHODS OF FORMING CARBON NANOTUBES

(75) Inventors: Xianfeng Wang, Suwon-si (KR); Hong-Sik Yoon, Seongnam-si (KR); In-Seok Yeo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 877 days.

(21) Appl. No.: 12/625,896

(22) Filed: Nov. 25, 2009

(65) Prior Publication Data
US 2010/0136226 A1  Jun. 3, 2010

(30) Foreign Application Priority Data
Dec. 1, 2008  (KR) .................. 10-2008-0120365

(51) Int. Cl.
*B82Y 40/00* (2011.01)

(52) U.S. Cl.
USPC .......... 427/122; 427/58; 427/249.1; 427/331; 427/346; 257/E33.03; 257/E51.04; 257/E21.038; 977/742; 977/842; 977/843

(58) Field of Classification Search
None
See application file for complete search history.

(56) References Cited

U.S. PATENT DOCUMENTS

| | | | | |
|---|---|---|---|---|
| 5,405,724 A | * | 4/1995 | Hsieh et al. | 430/58.8 |
| 5,452,905 A | * | 9/1995 | Bohmer et al. | 279/3 |
| 2002/0025374 A1 | * | 2/2002 | Lee et al. | 427/230 |
| 2004/0099438 A1 | * | 5/2004 | Arthur et al. | 174/257 |
| 2006/0086958 A1 | * | 4/2006 | Eimori | 257/301 |
| 2009/0280440 A1 | * | 11/2009 | Tarutani et al. | 430/325 |

FOREIGN PATENT DOCUMENTS

| | | | |
|---|---|---|---|
| KR | 2002-0003782 | * | 1/2002 |
| KR | 10-0376768 | | 3/2003 |
| KR | 10-0434272 | | 5/2004 |
| KR | 10-0593835 | | 6/2006 |

* cited by examiner

*Primary Examiner* — Nathan Empie
*Assistant Examiner* — Lisha Jiang
(74) *Attorney, Agent, or Firm* — Myers Bigel Sibley & Sajovec, P.A.

(57) ABSTRACT

Methods of forming carbon nanotubes include forming a catalytic metal layer on a sidewall of an electrically conductive region, such as a metal or metal nitride pattern. A plurality of carbon nanotubes are grown from the catalytic metal layer. These carbon nanotubes can be grown from a sidewall of the catalytic metal layer. The plurality of carbon nanotubes are then exposed to an organic solvent. This step of exposing the carbon nanotubes to the organic solvent may be preceded by a step of applying centrifugal forces to the plurality of carbon nanotubes. Alternatively, the exposing step may include applying a centrifugal force to the plurality of carbon nanotubes while simultaneously exposing the plurality of carbon nanotubes to an organic solvent.

15 Claims, 7 Drawing Sheets

METHODS OF FORMING CARBON NANOTUBES

REFERENCE TO PRIORITY APPLICATION

This application claims priority to Korean Patent Application No. 10-2008-0120365, filed Dec. 1, 2008, the contents of which are hereby incorporated herein by reference.

FIELD OF THE INVENTION

The present invention relates to integrated circuit devices and, more particularly, to methods of forming carbon nanotubes for integrated circuit devices.

BACKGROUND

As semiconductor devices are highly integrated and become smaller in size, new methods of forming semiconductor devices have been studied, and forming a CNT is one of the above methods. A CNT may substitute for a metal wiring of a semiconductor device, however, forming a CNT structure having reproducibility is not easy.

A CNT structure may be formed by vertically growing CNTs on a substrate on which catalyst patterns are formed. However, uniformly controlling lengths of and distances between the CNTs, and growing the CNTs only at specific portions of the substrate are not easy. Additionally, the CNTs vertically grown may not be adapted to all processes for manufacturing semiconductor devices.

SUMMARY

Methods of forming carbon nanotubes according to embodiments of the present invention include forming a catalytic metal layer on a sidewall of an electrically conductive region, such as a metal or metal nitride pattern. A plurality of carbon nanotubes are grown from the catalytic metal layer. In particular, these carbon nanotubes can be grown from a sidewall of the catalytic metal layer. The plurality of carbon nanotubes are then exposed to an organic solvent. This step of exposing the carbon nanotubes to the organic solvent may be preceded by a step of applying centrifugal forces to the plurality of carbon nanotubes. Alternatively, the exposing step may include applying a centrifugal force to the plurality of carbon nanotubes while simultaneously exposing the plurality of carbon nanotubes to an organic solvent. In these embodiments of the invention, the exposing step may include spin coating an organic solvent onto the plurality of carbon nanotubes.

According to additional embodiments of the invention, the step of forming a catalytic metal layer may be preceded by a step of forming the electrically conductive region on a surface of a substrate. The growing step may then include growing the plurality of carbon nanotubes from a sidewall of the catalytic metal layer and parallel to the surface.

Still further embodiments of the invention include forming carbon nanotubes by forming an electrically conductive layer on a substrate and then forming a catalytic metal layer on a sidewall of the electrically conductive layer. A plurality of carbon nanotubes are then grown from the catalytic metal layer. This plurality of carbon nanotubes may be exposed to an organic solvent. This application of the organic solvent may occur concurrently with applying a centrifugal force to the plurality of carbon nanotubes. For example, the exposing of the carbon nanotubes to the organic solvent and the application of the centrifugal force may be achieved by spin coating an organic solvent onto the plurality of carbon nanotubes. Moreover, in the event the substrate includes an electrically insulating layer thereon, then the growing may include growing the plurality of carbon nanotubes in a direction parallel to a surface on the electrically insulating layer. The application of the centrifugal force may also be achieved by rotating the substrate at a speed in a range from 3000 rpms and 5000 rpms.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

FIGS. 1 to 4 are cross-sectional views illustrating a method of forming a carbon nanotube (CNT) in accordance with example embodiments;

FIGS. 5 to 9 are cross-sectional views illustrating a method of forming a CNT in accordance with other example embodiments;

FIG. 10 is a block diagram illustrating a memory card including the horizontal CNTs in accordance with example embodiments;

FIG. 11 is a block diagram illustrating a portable device including the horizontal CNTs in accordance with example embodiments; and FIG. 12 is a block diagram illustrating a computer including the horizontal CNTs in accordance with example embodiments.

DETAILED DESCRIPTION OF THE EMBODIMENTS

Figure 1:
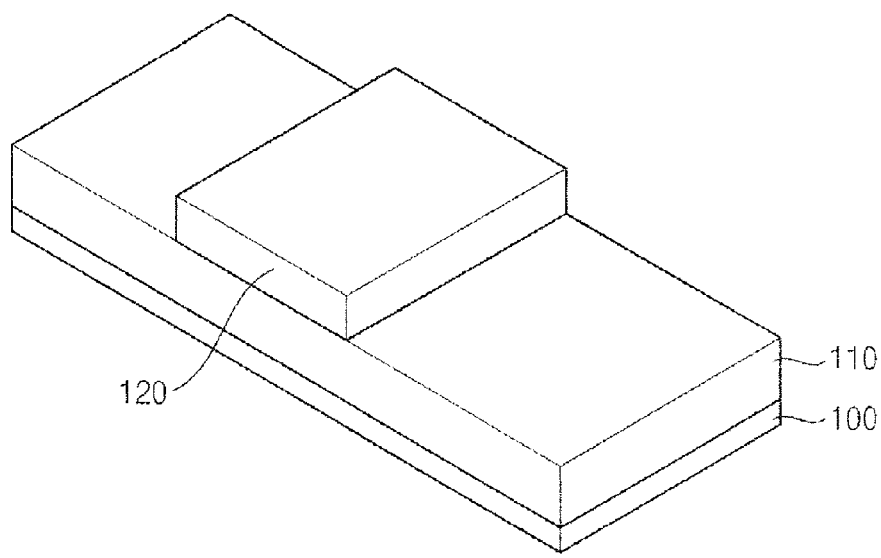

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 4 are cross-sectional views illustrating methods of forming carbon nanotubes (CNT) in accordance with example embodiments.

Referring to FIG. 1, a substrate 100 may be provided. The substrate 100 may include a semiconductor substrate such as a silicon substrate, a germanium substrate, a silicon-germanium substrate, etc., an epitaxial substrate, or an insulating substrate such as a glass substrate. The substrate 100 may include various devices thereon, e.g., transistors, contact plugs, bitlines, capacitors, metal wirings, etc.

An insulation layer 110 may be formed on the substrate 100. The insulation layer 110 may be formed using silicon oxide, silicon nitride, silicon oxynitride, indium tin oxide (ITO), aluminum oxide, etc. The silicon oxide may include borophosphor silicate glass (BPSG), phosphor silicate glass (PSG), undoped silicate glass (USG), spin on glass (SOG), plasma-enhanced tetraethyl-orthosilicate (PE-TEOS), etc.

A metal structure 120 may be formed on the insulation layer 110. The metal structure 120 may include a metal layer pattern or a metal nitride layer pattern of which a surface the CNT may grow from. The metal (nitride) layer pattern may include nickel, cobalt, iron, titanium, titanium nitride, etc. These may be used alone or in combination thereof. The metal (nitride) layer pattern may be formed by a deposition process using the above material. A capping layer (not shown) may be further formed on the metal (nitride) layer pattern.

Figure 2:
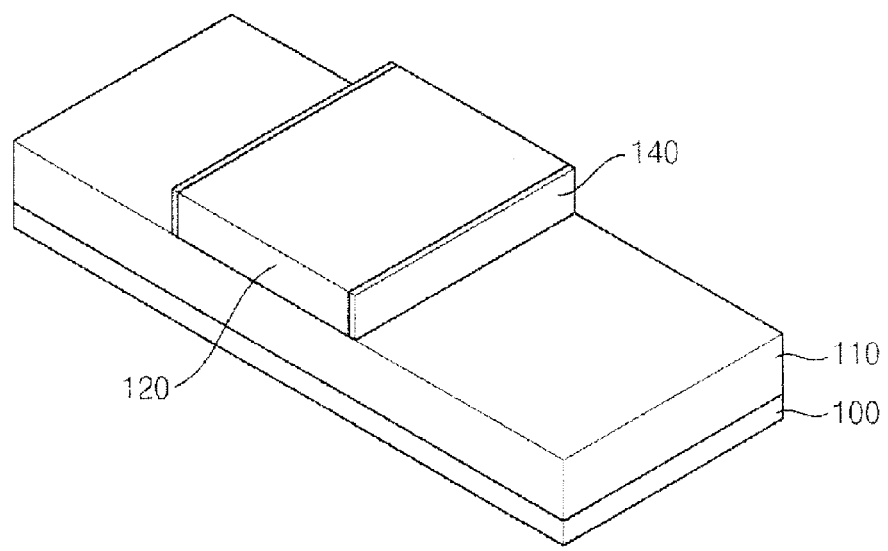

Referring to FIG. 2, a catalytic metal layer may be formed on the insulation layer 110 to cover the metal structure 120. The catalytic metal layer may include a catalyst material such as nickel, cobalt, iron, etc. The catalyst material layer may be annealed to have nano-particles such as nano-dots. The catalytic metal layer may be etched until a top surface of the metal structure 120 may be exposed, thereby forming a catalyst spacer 140 on sidewalls of the metal structure 120.

Figure 3:
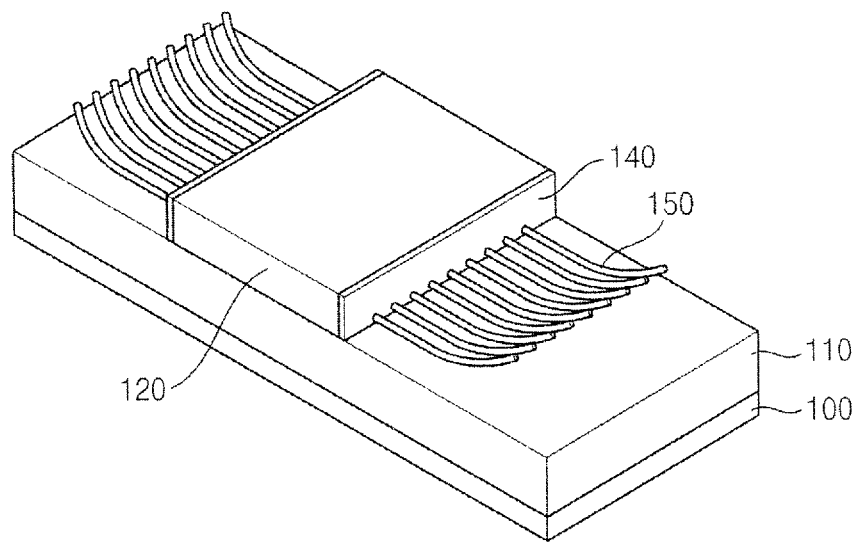

Referring to FIG. 3, a plurality of CNTs 150 may be formed on sidewall surfaces of the catalyst spacer 140. The CNTs 150 may be formed using a source gas including hydrocarbon. The source gas may be formed by vaporizing, e.g., methane, acetylene, carbon monoxide, benzene, ethylene, etc. The CNTs 150 may be formed by a catalytic thermal reduction process, a chemical vapor deposition (CVD) process, a thermal chemical vapor deposition process, a plasma-enhanced chemical vapor deposition (PE-CVD) process, a hot filament vapor deposition process, etc. The CNTs 150 may be grown by catalyst, and the performance of the catalyst material included in the catalyst spacer 140 may depend on the characteristics of a layer contacting the catalyst spacer 140. Thus, the catalyst spacer 140 may selectively grow the CNTs 150.

The CNTs 150 may grow on the sidewall surfaces of the catalyst spacer 140, and the grown CNTs 150 shown may not extend in a direction parallel to a top surface of the insulation layer 110 or the substrate 100, but an end portion of each CNT 150 may be bent upward, as shown in FIG. 3.

Figure 4:
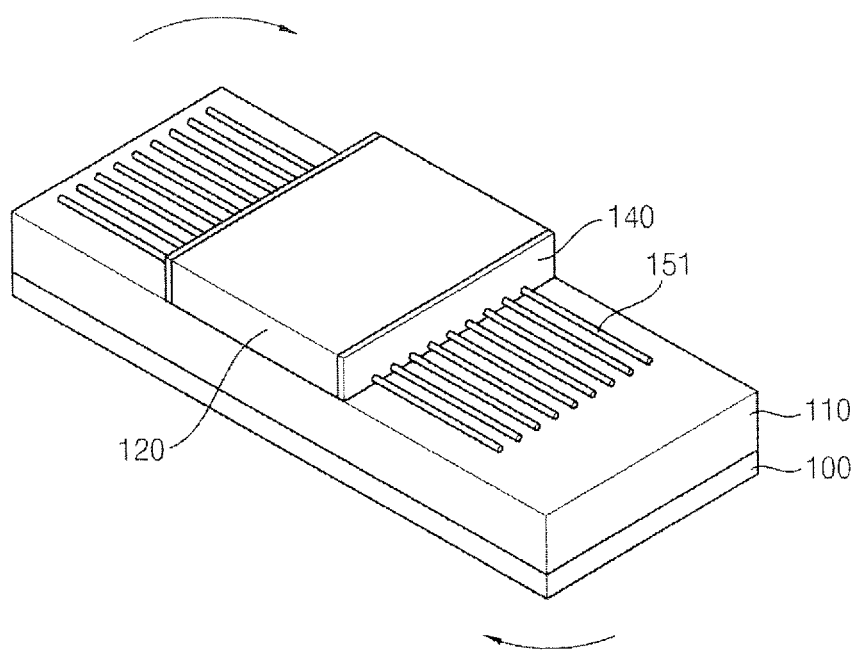

Referring to FIG. 4, the substrate 100 having the bent CNTs 150 thereover may be rotated. Thus, a tensile force and a compressive force may be applied to the CNTs 150. The tensile force may be generated by a turning force of the substrate 100, and the compressive force, which compresses the CNTs 150 downward, may be generated by a structure over the substrate 100, e.g., the metal structure 120 when the substrate 100 is rotated. In an example embodiment, the substrate 100 may be rotated at a speed of about 3,000 to about 5,000 rpm, preferably, about 3,500 to about 4,500 rpm.

A volatile organic solvent may be provided on the top surface of the insulation layer 110. The volatile organic solvent may include acetone, xylene, a volatile alcohol such as isopropyl alcohol, etc. The volatile organic solvent may be provided onto a central top surface of the insulation layer 110 and may be spin coated on the whole surface thereof by a centrifugal force. Thus, the CNTs 150 may be wet by the volatile organic solvent, and be adsorbed onto the top surface of the insulation layer 110. The volatile organic solvent may apply an adhesion force to the CNTs 150.

The bent CNTs 150 may be changed into a horizontal CNTs 151, which extends in the direction parallel to the top surface of the insulation layer 110 or the substrate 100, by the above three forces. The horizontal CNTs 151 may be close to the top surface of the insulation layer 110, and extend in the direction parallel to the top surface of the insulation layer 110 or the substrate 100.

FIGS. 5 to 9 are cross-sectional views illustrating methods of forming a CNT in accordance with other example embodiments.

Figure 5:
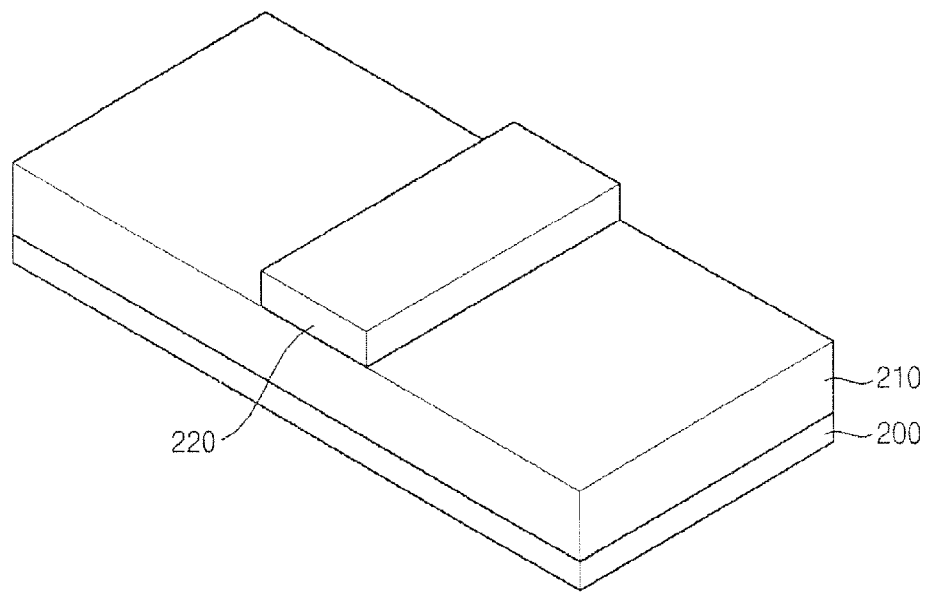

Referring to FIG. 5, a substrate 200 may be provided. The substrate 200 may include a semiconductor substrate such as a silicon substrate, a germanium substrate, a silicon-germanium substrate, etc., an epitaxial substrate, or an insulating substrate such as a glass substrate. The substrate 200 may include various devices thereon, e.g., transistors, contact plugs, bitlines, capacitors, metal wirings, etc.

An insulation layer 210 may be formed on the substrate 200. The insulation layer 210 may be formed using silicon oxide, silicon nitride, silicon oxynitride, indium tin oxide (ITO), aluminum oxide, etc. The silicon oxide may include borophosphor silicate glass (BPSG), phosphor silicate glass (PSG), undoped silicate glass (USG), spin on glass (SOG), plasma-enhanced tetraethyl-orthosilicate (PE-TEOS), etc.

A first metal layer pattern 220 may be formed on the insulation layer 210. The first metal layer pattern 220 may include a first metal such as nickel, cobalt, iron, titanium, etc. These may be used alone or in combination thereof. Alternatively, the first metal layer pattern 220 may include a metal nitride such as titanium nitride. The first metal layer pattern may be formed by performing a deposition process using the above material to form a first metal layer and patterning the first metal layer.

Figure 6:
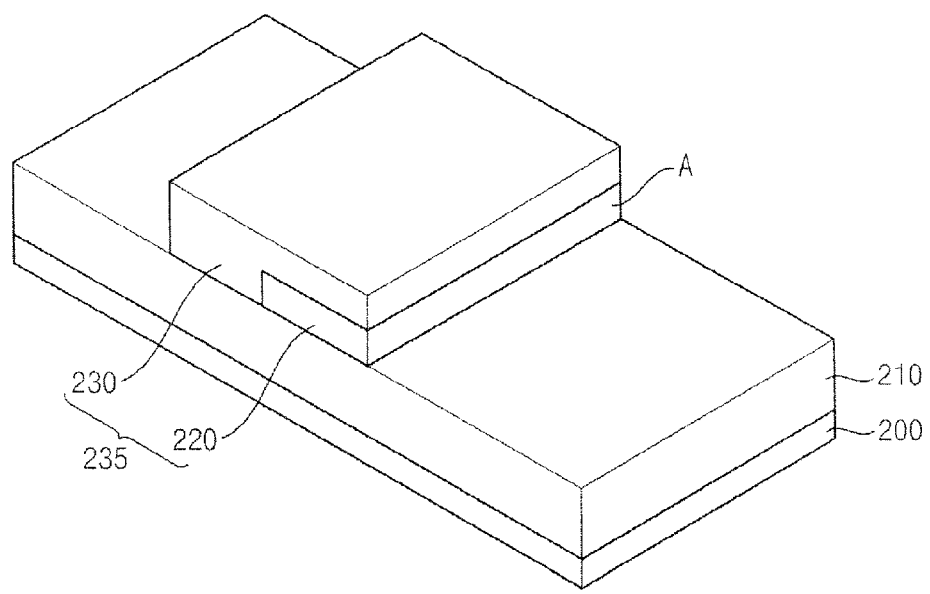

Referring to FIG. 6, a second metal layer may be formed on the insulation layer 210 to cover the first metal layer pattern 220. The second metal layer may include a second metal preventing a CNT from growing from a surface of the second metal layer. The second metal may include palladium, platinum, tungsten, niobium, vanadium, molybdenum, etc. These may be used alone or in combination thereof. The second metal layer may be formed by a deposition process.

The second metal layer may be patterned by a photolithography process so that a lateral surface A of the first metal layer pattern 220 may be exposed. Thus, a second metal layer pattern 230 surrounding the first metal layer pattern 220 except for the lateral surface A thereof may be formed.

The first and second metal layer patterns 220 and 230 may be called as a metal structure 235.

Figure 7:
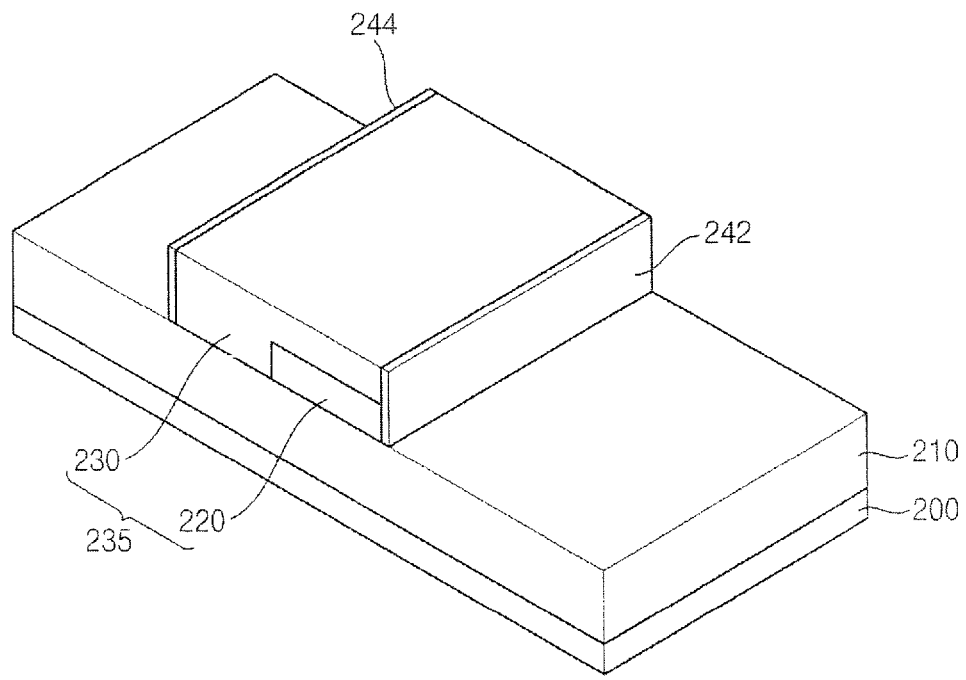

Referring to FIG. 7, a catalytic metal layer may be formed on the insulation layer 210 to cover the metal structure 235. The catalytic metal layer may include a catalyst material such as nickel, cobalt, iron, etc. The catalyst material layer may be annealed to have nano-particles such as nano-dots. The catalytic metal layer may be etched until a top surface of the metal structure 235 may be exposed, thereby forming first and second catalyst spacers 242 and 244 on sidewalls of the metal structure 235. The first catalyst spacer 242 may be formed on the sidewall of the metal structure 235 to contact the lateral surface A of the first metal layer pattern 220, and the second catalyst spacer 244 may be formed on the sidewall of the metal structure 235 to be spaced apart from the first metal layer pattern 220.

Figure 8:
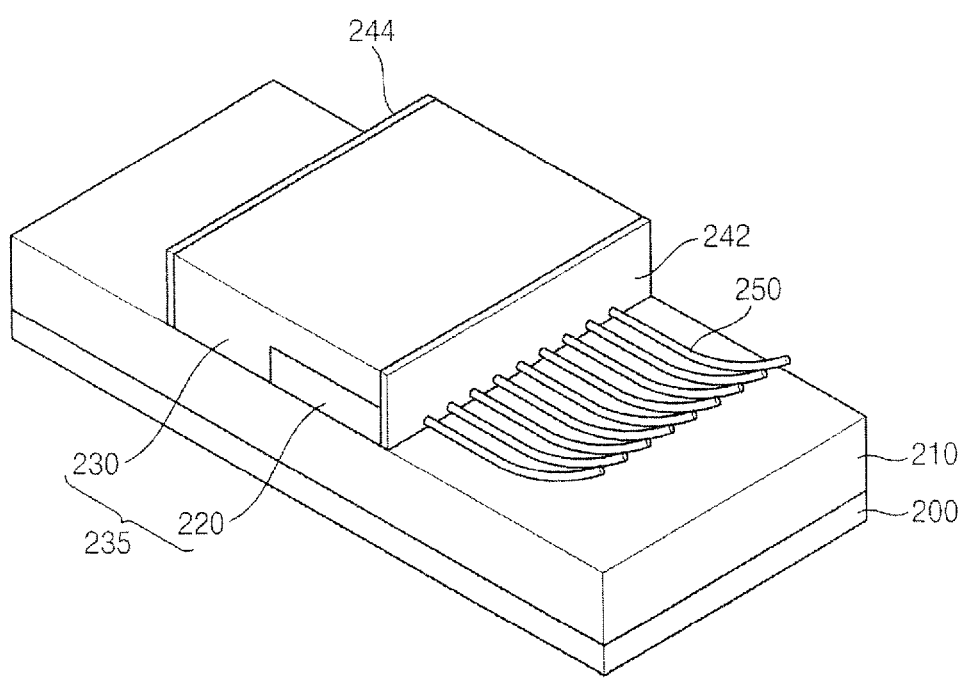

Referring to FIG. 8, a plurality of CNTs 250 may be formed on a lateral surface of the first catalyst spacer 242, and may not be formed on a lateral surface of the second catalyst spacer 244. The CNTs 250 may be grown by catalyst, and the performance of the catalyst material included in the catalyst spacers 242 and 244 may depend on the characteristics of the first and second metal layer patterns 220 and 230 contacting the catalyst spacers 242 and 244, respectively. Thus, only the first catalyst spacer 242 may grow the CNTs 250. The CNTs 250 may be formed using a source gas including hydrocarbon. The source gas may be formed by vaporizing, e.g., methane, acetylene, carbon monoxide, benzene, ethylene, etc. The CNTs 250 may be formed by a catalytic thermal reduction process, a CVD process, a thermal chemical vapor deposition process, a PE-CVD process, a hot filament vapor deposition process, etc.

The CNTs 250 may grow only on the lateral surface of the first catalyst spacer 242, and the grown CNTs 250 shown may not extend in a direction parallel to a top surface of the insulation layer 210, but an end portion of each CNT 250 may be bent upward, as shown in FIG. 8.

Figure 9:
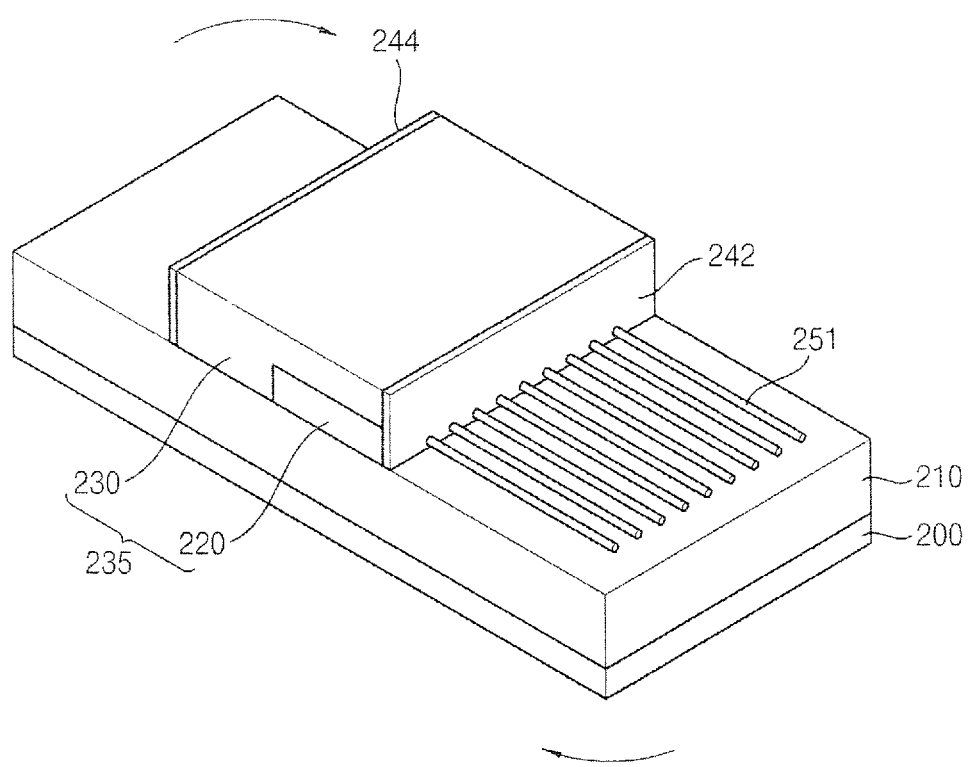

Referring to FIG. 9, the substrate 200 including the bent CNTs 250 thereover may be rotated. Thus, a tensile force and a compressive force may be applied to the CNTs 250. The tensile force may be generated by a turning force of the substrate 200, and the compressive force, which compresses the CNTs 250 downward, may be generated by a structure over the substrate 100, e.g., the metal structure 235 when the substrate 200 is rotated. In an example embodiment, the substrate 200 may be rotated at a speed of about 3,000 to about 5,000 rpm, preferably, about 3,500 to about 4,500 rpm.

A volatile organic solvent may be provided on the top surface of the insulation layer 210. The volatile organic solvent may include acetone, xylene, a volatile alcohol such as isopropyl alcohol, etc. The volatile organic solvent may be provided onto a central top surface of the insulation layer 210 and may be spin coated on the whole surface thereof by a centrifugal force. Thus, the CNTs 250 may be wet by the volatile organic solvent, and be adsorbed onto the top surface of the insulation layer 210. The volatile organic solvent may apply an adhesion force to the CNTs 250.

The bent CNTs 250 may be changed into a horizontal CNTs 251, which extends in the direction parallel to the top surface of the insulation layer 210 or the substrate 200, by the above three forces. The horizontal CNTs 251 may be very close to the top surface of the insulation layer 210, and extend in the direction parallel to the top surface of the insulation layer 210 or the substrate 200, as shown in FIG. 9. The CNTs 251 may substitute for metal wirings in dynamic random access memory (DRAM) devices, flash memory devices, phase-change memory (PRAM) devices, etc.

Figure 10:
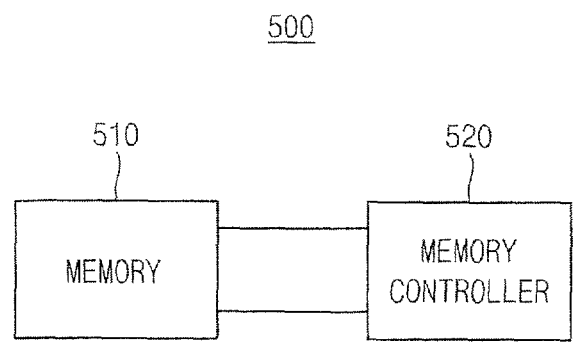

FIG. 10 is a block diagram illustrating a memory card including the horizontal CNTs in accordance with example embodiments.

Referring to FIG. 10, a memory card 500 may include a memory controller 520 connected to a memory 510. The memory 510 may be a DRAM or a flash memory (an NAND flash memory or an NOR flash memory) having the horizontal CNTs in accordance with example embodiments. The horizontal CNTs may also serve as wirings in a logic circuit of the memory controller 520. The memory controller 520 may provide the memory 510 with input signals to control operations of the memory 510. For example, in the memory card 500, the memory controller 520 may transfer commands of a host to the memory 510 to control input/output data and/or may control various data of a memory based on an applied control signal. In addition to a simple memory card, the present invention may be applied to other digital devices which include a similar operative association between a memory and a memory controller.

Figure 11:
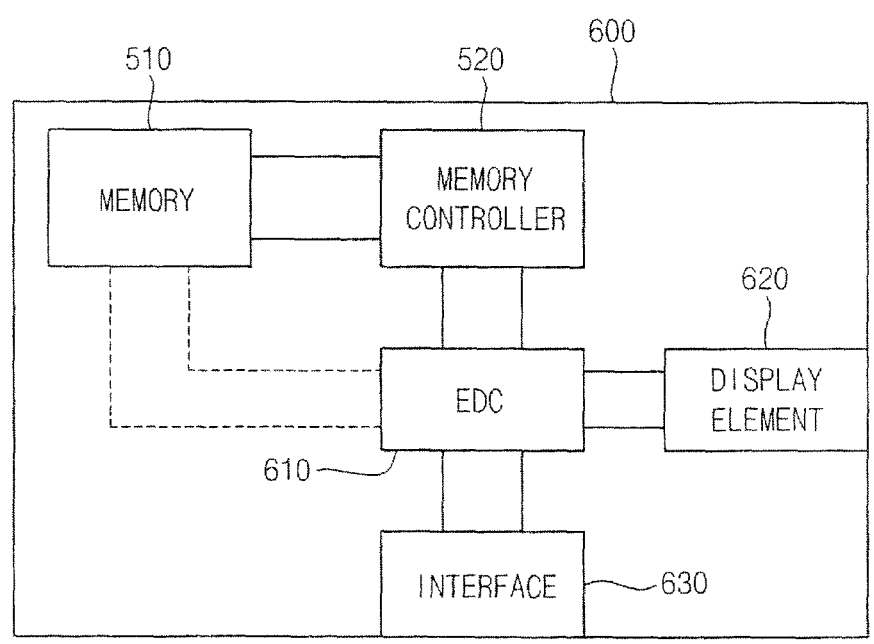

FIG. 11 is a block diagram illustrating a portable device including the horizontal CNTs in accordance with example embodiments.

Referring to FIG. 11, a portable device 600 may include an MP3 player, a video player, or a portable multi-media player (PMP). The portable device 600 may include a memory 510 having the horizontal CNTs according to example embodiments, and a memory controller 620 as described above. The memory 510 may be a DRAM or flash memory including the horizontal CNTs.

The portable device 600 may include an encoder/decoder (EDC) 610, a display element 620 and an interface 630. As illustrated by the dashed lines of FIG. 11, data may be directly input from the EDC 610 to the memory 510, or directly output from the memory 510 to the EDC 610.

The EDC 610 may encode data to be stored in the memory 510. For example, the EDC 610 may execute encoding for storing audio data and/or video data in the memory 510 of an MP3 player or a PMP player. Furthermore, the EDC 610 may execute MPEG encoding for storing video data in the memory 510. The EDC 610 may include multiple encoders to encode different types of data depending on their formats. For example, the EDC 610 may include an MP3 encoder for encoding audio data and an MPEG encoder for encoding video data.

The EDC 610 may also decode data being output from in the memory 510. For example, the EDC 610 may decode MP3 audio data from the memory 510. Furthermore, the EDC 610 may decode MPEG video data from the memory 510. The EDC 610 may include multiple decoders to decode different types of data depending on their formats. For example, the EDC 610 may include an MP3 decoder for audio data and an MPEG decoder for video data.

The EDC 610 may include only a decoder. For example, encoded data may be input to the EDC 610, and then the EDC 610 may decode the input data and transfer the decoded data to the memory controller 520 or the memory 510.

The EDC 610 may receive data to be encoded or data being encoded by way of the interface 630. The interface 630 may be compliant with standard input devices, e.g. FireWire, or a USB. That is, the interface 630 may include a FireWire interface, an USB interface or the like. Data is output from the memory 510 by way of the interface 630.

The display element 620 may display to an end user data output from the memory 510 and decoded by the EDC 610. For example, the display element 620 may be an audio speaker or a display screen.

Figure 12:
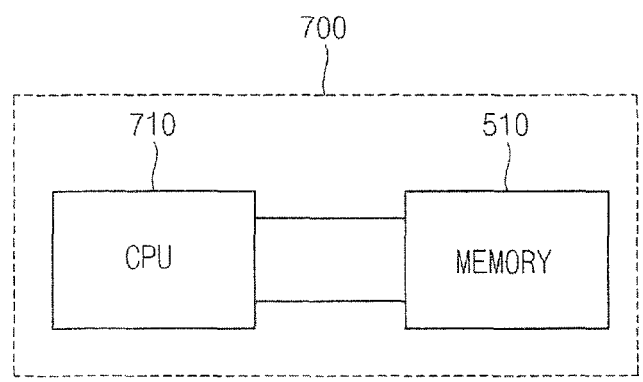

FIG. 12 is a block diagram illustrating a computer including the horizontal CNTs in accordance with example embodiments.

Referring to FIG. 12, a computer 700 may include a memory 510 and a central processing unit (CPU) 710 connected to the memory 510. The memory 510 may be a DRAM or a flash memory having the horizontal CNTs in accordance with example embodiments. An example of such a computer 700 may be a laptop computer including a flash memory as its main memory. The memory 510 may be directly connected to the CPU 710, or indirectly connected to the CPU 710 by buses. The computer 700 may have other conventional auxiliary devices (not illustrated in FIG. 12).

According to example embodiments, a plurality of CNTs may be grown from a catalyst spacer on sidewalls of a metal structure on a substrate, and a volatile organic solvent may be provided onto the substrate to give the CNTs an adhesion force. Thus, the CNTs may extend in a direction parallel to a top surface of the substrate.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming carbon nanotubes, comprising:
    forming a catalytic metal layer on a sidewall of an electrically conductive region, which is disposed on an underlying substrate;
    growing a plurality of spaced-apart carbon nanotubes from the catalytic metal layer; and
    exposing the plurality of carbon nanotubes to an organic solvent to thereby wet the plurality of carbon nanotubes and cause at least some of the plurality of spaced-apart carbon nanotubes that are spaced from an upper surface of the substrate to be adsorbed onto an upper surface of the substrate in response to an adhesion force provided by the organic solvent;
    wherein said exposing is preceded by applying a centrifugal force to the plurality of carbon nanotubes.

2. The method of claim 1, wherein said applying a centrifugal force comprises rotating the substrate at a speed in a range from 3000 rpms and 5000 rpms.

3. A method of forming carbon nanotubes, comprising:
    forming a catalytic metal layer on a sidewall of an electrically conductive region, which is disposed on an underlying substrate;
    growing a plurality of spaced-apart carbon nanotubes from the catalytic metal layer; and
    exposing the plurality of carbon nanotubes to an organic solvent to thereby wet the plurality of carbon nanotubes and cause at least some of the plurality of spaced-apart carbon nanotubes that are spaced from an upper surface of the substrate to be adsorbed onto an upper surface of the substrate in response to an adhesion force provided by the organic solvent;
    wherein said exposing comprises applying a centrifugal force to the plurality of carbon nanotubes while simultaneously exposing the plurality of carbon nanotubes to the organic solvent.

4. The method of claim 3, wherein said forming a catalytic metal layer is preceded by forming the electrically conductive region on a surface of a substrate; and wherein said growing comprises growing the plurality of carbon nanotubes from a sidewall of the catalytic metal layer and parallel to the surface.

5. A method of forming carbon nanotubes, comprising:
    forming a catalytic metal layer on a sidewall of an electrically conductive region, which is disposed on an underlying substrate;
    growing a plurality of spaced-apart carbon nanotubes from the catalytic metal layer; and
    exposing the plurality of carbon nanotubes to an organic solvent to thereby wet the plurality of carbon nanotubes and cause at least some of the plurality of spaced-apart carbon nanotubes that are spaced from an upper surface of the substrate to be adsorbed onto an upper surface of the substrate in response to an adhesion force provided by the organic solvent;

wherein said exposing comprises spin coating the organic solvent onto the plurality of carbon nanotubes.

6. The method of claim 5, wherein said forming a catalytic metal layer is preceded by forming the electrically conductive region on a surface of a substrate; and wherein said growing comprises growing the plurality of carbon nanotubes from a sidewall of the catalytic metal layer and parallel to the surface.

7. The method of claim 5, wherein the organic solvent comprises any one selected from the group consisting of acetone, xylene, and isopropyl alcohol.

8. A method of forming carbon nanotubes, comprising:

forming a catalytic metal layer on a sidewall of an electrically conductive region, which is disposed on an underlying substrate;

growing a plurality of spaced-apart carbon nanotubes from the catalytic metal layer; and exposing the plurality of carbon nanotubes to an organic solvent to thereby wet the plurality of carbon nanotubes and cause at least some of the plurality of spaced-apart carbon nanotubes that are spaced from an upper surface of the substrate to be adsorbed onto an upper surface of the substrate in response to an adhesion force provided by the organic solvent;

wherein the substrate comprises an electrically insulating layer thereon;

wherein said growing comprises growing the plurality of spaced-apart carbon nanotubes in a direction parallel to a surface on the electrically insulating layer; and wherein said exposing comprises spin coating the organic solvent onto the surface of the electrically insulating layer.

9. A method of forming a carbon nanotube (CNT), comprising:

forming an insulation layer on a substrate;

forming a metal structure on the insulation layer;

forming a catalyst spacer on a sidewall of the metal structure;

growing a plurality of CNTs from a lateral surface of the catalyst spacer, the plurality of CNTs being spaced apart from an upper surface of the insulation layer;

rotating the substrate having the CNTs thereover; and providing a volatile organic solvent onto the insulation layer to wet the CNTs so that the plurality of CNTs are adsorbed onto the upper surface of the insulation layer due to an adhesion force provided by the volatile organic solvent.

10. The method of claim 9, wherein the wet CNTs extend in a direction parallel to a top surface of the insulation layer.

11. The method of claim 9, wherein the metal structure includes a metal layer pattern from which the CNTs are grown, and the metal layer pattern comprises at least one selected from the group consisting of nickel, cobalt, iron and titanium.

12. The method of claim 9, wherein forming the catalyst spacer on the sidewall of the metal structure includes:

forming a catalytic metal layer on the insulation layer to cover the metal structure; and etching the catalytic metal layer until a top surface of the metal structure is exposed.

13. The method of claim 9, wherein rotating the substrate having the CNTs thereover includes rotating the substrate at a speed of about 3,000 to about 5,000 rpm.

14. The method of claim 9, wherein the volatile organic solvent comprises any one selected from the group consisting of acetone, xylene, and isopropyl alcohol.

15. The method of claim 9, wherein rotating the substrate having the CNTs thereover includes applying a tensile force and a compressive force to the CNTs, and providing the volatile organic solvent includes applying an adhesion force to the CNTs.

* * * * *